(12) United States Patent
Tadjpour (10) Patent No.: US 8,154,351 B2
(45) Date of Patent: Apr. 10, 2012

(54) VOLTAGE-CONTROLLED OSCILLATOR AND GAIN CALIBRATION TECHNIQUE FOR TWO-POINT MODULATION IN A PHASE-LOCKED LOOP

(75) Inventor: Shahrzad Tadjpour, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 1085 days.

(21) Appl. No.: 12/035,296

(22) Filed: Feb. 21, 2008

(65) Prior Publication Data

US 2012/0049913 A1 Mar. 1, 2012

(51) Int. Cl.
H03B 5/00 (2006.01)
H03L 7/08 (2006.01)
H03L 7/099 (2006.01)
H04B 1/00 (2006.01)
H04B 1/38 (2006.01)

(52) U.S. Cl. ........... 331/25; 331/14; 331/17; 331/177 V; 331/179; 375/376; 455/260

(58) Field of Classification Search ................... 331/1 A, 331/14, 16–18, 25, 44, 177 R, 177 V, 179; 375/376; 455/260
See application file for complete search history.

(56) References Cited

U.S. PATENT DOCUMENTS 7,612,617 B2 * 11/2009 Pullela et al. ................... 331/16
7,956,699 B2 * 6/2011 Matsuura et al. ............. 332/126

\* cited by examiner

Primary Examiner — David Mis
(74) Attorney, Agent, or Firm — Knobbe Martens Olson & Bear, LLP (57) ABSTRACT

A VCO in a phase-locked loop (PLL) is arranged to receive low-pass data via a first input and high-pass data at a second input. The first input is coupled to a first set of varactors in the VCO. The second input is coupled to a second set of varactors in the VCO. The controller sets the input voltage at the first input and directs a charge pump to operate in a tri-state mode that opens the feedback loop of the PLL. The controller applies different voltages via the second input and measures the change in output frequency. A present gain of the VCO is determined from the ratio of the change in frequency and the change in voltage at the second input.

21 Claims, 5 Drawing Sheets

FIG. 5

VOLTAGE-CONTROLLED OSCILLATOR AND GAIN CALIBRATION TECHNIQUE FOR TWO-POINT MODULATION IN A PHASE-LOCKED LOOP

BACKGROUND

This invention relates generally to transceiver architecture in a wireless portable communication device. More particularly, the invention relates to systems and methods for performing a gain calibration in open loop and closed loop data paths in a multiple mode transceiver.

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband time-division multiple access (TDMA), a Gaussian minimum shift keying (GMSK) modulation scheme is used to communicate data.

The deployment of new wireless systems presents unique challenges to mobile handset designers. In order to reap the full benefit of expanded capacity and increased data bandwidth, the new handsets must work on both the new systems as well as the old. One of these new systems is referred to as Enhanced Data Rates for GSM Evolution (EDGE). The EDGE standard is an extension of the Global System for Mobile Communications (GSM) standard.

The EDGE standard increases the data rate over that available with GSM by sending more bits per RF burst. More bits are sent in EDGE by using a modulation scheme based on 8-phase shift keying (8-PSK), which provides an increase over GSM's Gaussian minimum shift keying (GMSK) modulation format. In the EDGE modulation scheme, the 8-PSK constellation is rotated 3 radians every symbol period to avoid problems associated with zero crossings. In contrast to GMSK's constant amplitude envelope, the added rotation factor in the EDGE modulation scheme results in a non-constant amplitude envelope. This non-constant amplitude envelope presents some difficulties with regard to RF power control. These problems are exacerbated by the desire to have a single transmitter that can be used for both the GSM and EDGE standards.

The two point modulation scheme used to support both GMSK and EDGE sets stringent requirements on gain alignment (voltage-controlled oscillator (VCO) gain or $K_{vco}$) between open loop and closed loop data paths in the transmitter. Simulations indicate that in order to meet the spectral mask specifications for both standards, $K_{vco}$ should be known to an accuracy of less than 2%.

In order to account for the effects of channel frequency variation and temperature drift, $K_{vco}$ must be measured or otherwise determined before the start of each transmit burst. Approximately 150 microseconds is available to measure and adjust perform any required digital frequency centering, and to settle the phase-locked loop. Thus, less than 150 microseconds is available before the start of each data burst to measure and adjust $K_{vco}$.

One approach to measure $K_{vco}$ includes using the sigma-delta modulator to adjust the divider in the feedback path and measuring the corresponding change in the analog voltage applied at the input to the VCO using an analog-to-digital converter (ADC). This approach fails to account for gain in the digital-to-analog converter (DAC), which supplies high-pass data to the VCO. Consequently, this first approach ignores the gain introduced in the high-pass data path and does not provide an accurate estimate of $K_{vco}$.

A second approach applies a step voltage to the VCO through the DAC and measures the change in frequency at the output of the VCO. Conventional VCOs include a single varactor with two modulation ports. An array of switchable capacitors under digital control is adjusted to bring the VCO close to its final frequency value. Thereafter, the PLL takes over and locks the loop such that the output frequency of the PLL stabilizes. As a result, an accurate measurement of $K_{vco}$ using this second method is dependent on the combination of the correct digital control signal and the input voltage to the VCO. In order to receive an accurate value for the input voltage to the VCO, the PLL must be allowed to settle. Accordingly, to apply a step voltage to the VCO through the DAC and accurately determine $K_{vco}$, the loop must be locked at both the initial DAC value and the final DAC value. Thereafter, the change in frequency is divided by the difference of the digital input signals to the DAC to calculate $K_{vco}$. However, to achieve $K_{vco}$ accuracy of less than 2%, a period of time in excess of that permitted before a data transmission burst in GMSK and EDGE communication standards is required.

Therefore, it would be desirable to economically, efficiently and accurately measure $K_{vco}$ to less than 2% accuracy in the limited time available before the start of a data burst.

SUMMARY

An embodiment of a method for measuring the gain of a voltage-controlled oscillator (VCO) in a phase-locked loop (PLL) configured to apply a two-point modulation scheme includes the steps of opening a feedback loop of the PLL, directing the VCO via a first input to produce a desired output frequency, applying a first control signal to a second input of the VCO, configuring an array of capacitors in the VCO, measuring the output frequency of the VCO responsive to the first control signal, applying a second control signal to the second input of the VCO, measuring the output frequency of the VCO responsive to the second control signal and determining the gain of the VCO as a function of the output frequency and a voltage applied at the second input of the VCO.

Embodiments of a system include a phase-locked loop (PLL) and a controller. The PLL is arranged to receive high-pass data and low-pass data for application in respective inputs of a voltage-controlled oscillator (VCO), the VCO having a first set of varactors configured to receive a low-pass tuning voltage and a second set of varactors configured to receive a high-pass tuning voltage. The controller executes a calibration procedure to determine a present gain of the VCO.

An embodiment of a method for calibrating a transceiver configured to apply a two-point modulation scheme includes the steps of directing a charge pump to a tri-state mode to open a feedback path in the PLL, directing a voltage-controlled oscillator (VCO) in a phase-locked loop (PLL) to generate a desired output frequency by applying a desired voltage at a low-pass data input to the VCO, using a digital-to-analog converter to apply a first control signal to a high-pass data input of the VCO, the first control signal resulting in a first tuning voltage, configuring an array of capacitors in the VCO, measuring a first frequency at the output of the VCO responsive to the first tuning voltage, using the digital-to-analog converter to apply a second control signal different from the first control signal to the high-pass data input of the VCO, the second control signal resulting in a second tuning voltage, measuring a second frequency at the output of the VCO responsive to the second tuning voltage, determining the gain of the VCO as a function of the difference of the second frequency and the first frequency and the difference of the second tuning voltage and the first tuning voltage and adjusting the transceiver in response to the gain of the VCO prior to transmitting data from the transceiver.

The figures and detailed description that follow are not exhaustive. The disclosed embodiments are illustrated and described to enable one of ordinary skill to make and use systems and methods for VCO gain calibration in a phase-locked loop. Other embodiments, features and advantages of the systems and methods for VCO gain calibration will be or will become apparent to those skilled in the art upon examination of the following figures and detailed description. All such additional embodiments, features and advantages are within the scope of the disclosed systems and methods as defined in the accompanying claims.

BRIEF DESCRIPTION OF THE FIGURES

The systems and methods for determining the gain of a VCO can be better understood with reference to the following figures. The components within the figures are not necessarily to scale, emphasis instead being placed upon clearly illustrating the principles and operation of the systems and methods. Moreover, in the figures, like reference numerals designate corresponding parts throughout the different views.

DETAILED DESCRIPTION

Individual components of a PLL and a controller for calibrating $K_{vco}$ of the PLL can be implemented in software or various combinations of software and hardware. When implemented in hardware, the PLL and the controller can be implemented on a single integrated circuit (e.g., an application specific integrated circuit) or one or both of the PLL and the controller can be implemented using separate hardware elements and logic. When the controller is implemented partially in software, the software portion can be used to control a DAC, a charge pump and a low-pass input to a VCO that are integrated with the PLL. The software can be stored in a memory and executed by a suitable instruction execution system (e.g., a microprocessor). A hardware implementation of the controller and the PLL can include any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), etc.

The software for the controller comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

In order to meet the stringent requirements on gain alignment ($K_{vco}$) between the low-pass and high-pass data paths in a communication system that applies a two-point modulation scheme for GMSK and EDGE, a VCO (in the PLL) is arranged with a first set of varactors that receive a low-pass tuning voltage from a low-pass input and a second set of varactors that receive a high-pass tuning voltage from a high-pass input. It has been determined that by using a separate set of varactors for each modulation path that high pass $K_{vco}$ is independent of the voltage applied at the low-pass input of the VCO if the output frequency approximates the final frequency of the PLL.

Accordingly, a controller coupled to the PLL is configured to adjust the PLL and apply a first control signal at the VCO. As part of the adjustment to the PLL, the controller opens the feedback loop, applies a desired voltage at the low-pass input, applies a desired DAC value (i.e., a first control signal) such that the DAC generates a desired tuning voltage at the second or high-pass input and configures an array of capacitors in the VCO to bring the frequency of VCO close to its final value. Thereafter, the controller measures and records the frequency at the output of the VCO responsive to the first control signal. For example, the controller may use a frequency counter to measure the frequency at the output of the VCO. Next, while leaving the feedback loop open, and maintaining the same configuration of the array of capacitors and the voltage at the first input, the controller applies a second DAC value (i.e., a second control signal) different from the first DAC value at the second or high-pass input of the VCO. Thereafter, the controller measures and records the frequency at the output of the VCO responsive to the second DAC value. The controller or other baseband elements in a transceiver use the first and second measured frequency values and the DAC values applied at the second or high-pass input of the VCO to determine $K_{vco}$. The frequency of the signal at the output of the VCO can be measured by a counter. $K_{vco}$ is determined as the difference in the measured frequencies divided by the change in voltage corresponding to the DAC value step. Once calculated, the present $K_{vco}$ is used to adjust the transceiver as may be required per the present operating conditions and desired transmission scheme. The above-described method can be applied in the time available prior to each data transmission for transceivers using GMSK/EDGE modulation.

Figure 1:
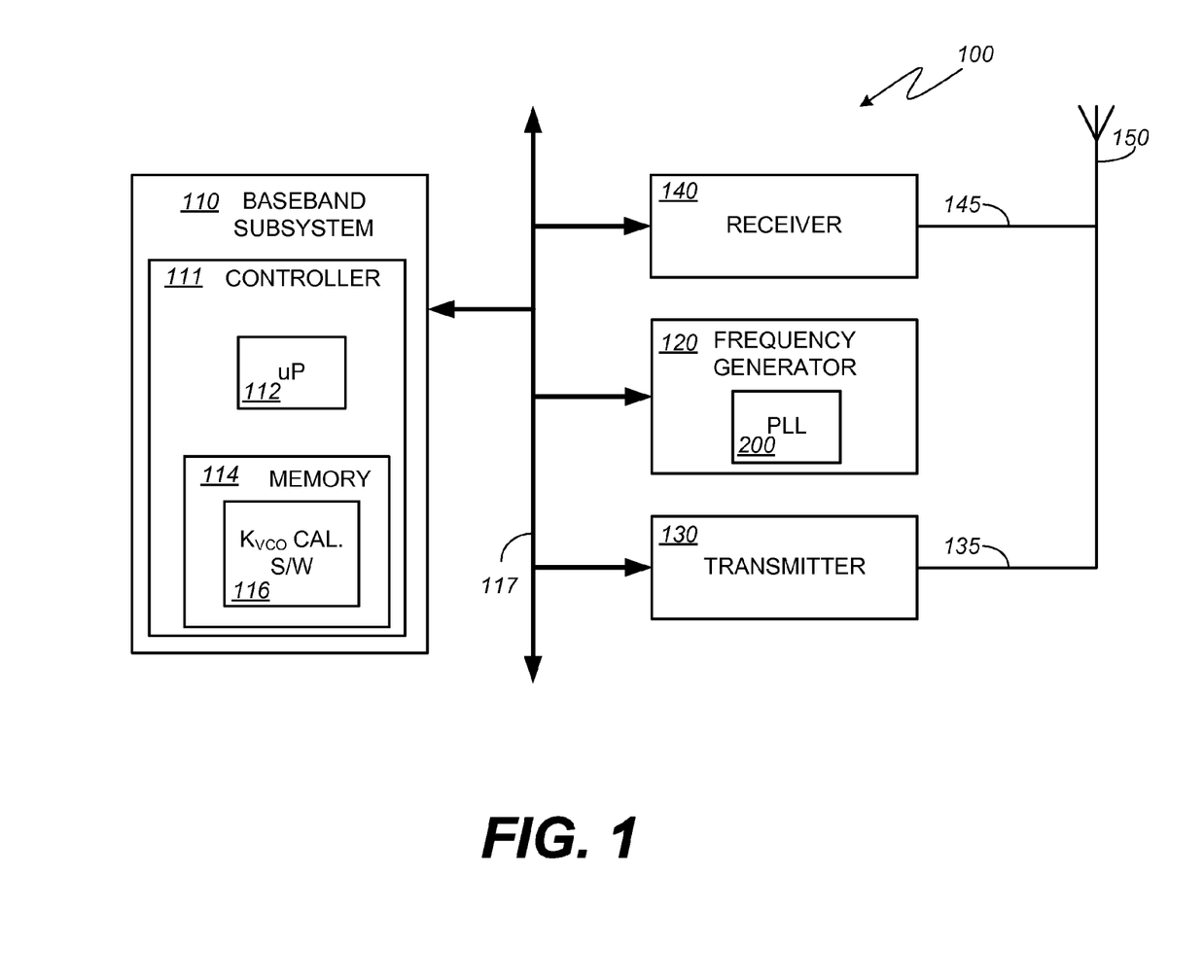
FIG. 1 is a block diagram illustrating an embodiment of a transceiver.
Figure 2:
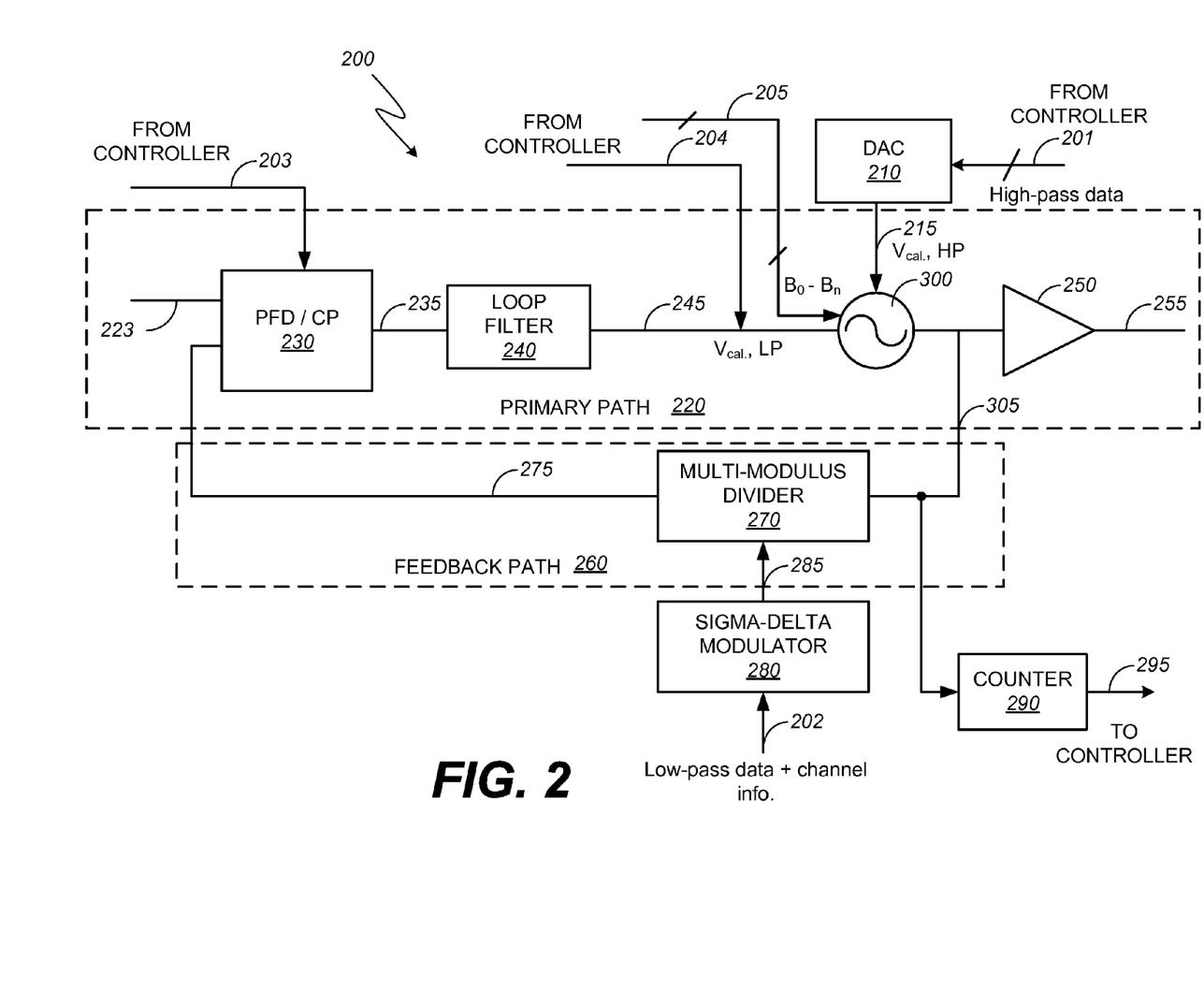
FIG. 2 is a circuit diagram illustrating an embodiment of the phase-locked loop of FIG. 1.

Having generally described a VCO and the operation of the systems and methods for measuring the gain of a VCO in a PLL, various additional embodiments will be described with respect to FIGS. 1-5. FIG. 1 is a block diagram illustrating an embodiment of a simplified portable transceiver 100. Embodiments of the systems and methods for measuring $K_{vco}$ can be implemented in any transceiver that applies GMSK/EDGE protocols. The portable transceiver 100 illustrated in FIG. 2 is intended to be a simplified example and to illustrate one of many possible applications in which the systems and methods for measuring $K_{vco}$ can be implemented. One having ordinary skill in the art will understand the operation of a portable transceiver. The portable transceiver 100 includes a baseband subsystem 110, a frequency generator 120, a transmitter 130, and a receiver 140 connected via a communication bus 117. The transmitter 130 and receiver 140 are also connected to antenna 150 so the portable transceiver 100 can transmit and receive radio frequency (RF) signals. The transmitter 130 is coupled to the antenna 150 via link 135 and the receiver 140 is coupled to the antenna 150 via link 145.

The frequency generator 120, which includes a phase-locked loop (PLL) 200, creates one or more reference frequencies that are distributed to the receiver 140 and the transmitter 130. The receiver 140 uses one or more reference frequencies to down convert received RF signals from the received RF frequency to an intermediate frequency or to baseband to facilitate recovery of the received signal. The transmitter 130 uses one or more reference frequencies to up convert transmit signals from baseband to an intermediate frequency or to the RF transmit frequency to broadcast the transmit signal. In order to account for the effects of channel frequency variation and temperature drift, $K_{vco}$ must be measured or otherwise determined before the start of each transmit burst.

If portions of the systems and methods for measuring $K_{vco}$ are implemented in software, then the baseband module 110 also includes a controller 111 that directs and coordinates a $K_{vco}$ calibration procedure. As shown in FIG. 1, the controller 111 includes a microprocessor 112 and a memory 114. $K_{vco}$ calibration software 116 in the memory 114 is accessed and executed by the microprocessor 112, or by another processor to control the operation of the systems and methods for measuring $K_{vco}$ to be described below. If portions of the systems and methods for measuring $K_{vco}$ are implemented in hardware, then the baseband module 110 may include an arithmetic logic unit or an application specific integrated circuit, as well as registers and other elements.

The local interface 117 can be, for example but not limited to, one or more buses or other wired connections, as is known in the art. The local interface 117 may have additional elements, such as buffers (caches), drivers, and repeaters, to enable communications. Further, the local interface 117 may include address, control, power and/or data connections to enable appropriate communications among the aforementioned components.

The microprocessor 112 is a hardware device for executing software or logic, particularly $K_{vco}$ calibration software 116 stored in the memory 114. The microprocessor 112 can be any custom made or commercially available processor configured to execute instructions.

The memory 114 can include any one or a combination of volatile memory elements (e.g., random-access memory (RAM), such as dynamic random-access memory (DRAM), static random-access memory (SRAM), synchronous dynamic random-access memory (SDRAM), etc.) and non-volatile memory elements (e.g., read-only memory (ROM), a flash memory, an electronically erasable programmable read only memory (EEPROM), etc.). The memory 114 can have a distributed architecture, where various components are situated remote from one another, but still accessible via the processor 112. Although not illustrated in FIG. 1, the memory 114 will include registers or storage locations for receiving and storing frequency values, control signal values and one or more conversion factors.

FIG. 2 is a simplified diagram illustrating an embodiment of the phase-locked loop 200 of FIG. 1. The PLL 200 includes a primary path 220 and a feedback path 260. The primary path 220 includes a phase/frequency detector with a charge pump 230, a loop filter 240, a VCO 300 and an amplifier 250. The feedback path 260 includes a multiple-modulus divider 270, which operates under direction received from a sigma-delta modulator 280. The feedback path 260 starts at the output of VCO 300 on connection 305 and ends at an input to the phase/frequency detector/charge pump 230 on connection 275.

The primary path 220 is arranged as follows. The phase/frequency detector/charge pump 230 receives a reference frequency via connection 223, a feedback signal (frequency) via connection 275 and generates an output that is a measure of the phase/frequency difference between the reference frequency and the feedback signal. The output is applied via connection 235 to the loop filter 240. The loop filter 240 filters the phase/frequency output or error signal and applies the filtered output to VCO 300 via connection 245. The connection 245 provides a first or low-pass input to VCO 300. This first or low-pass input 245 provides a voltage to the VCO 300. When the PLL 200 is operating under the direction of controller 111 (FIG. 1), the voltage $V_{cal}$, LP applied at connection 245 is controlled via input 204. The VCO 300 is also coupled to a frequency control bus 205, which provides a digital frequency control on individual connections $B_0$ to $B_n$ to adjust a switchable capacitor array in the VCO 300. The switchable capacitor array sets the VCO frequency close to a desired value. The frequency control bus 205 is coupled to the controller 111 or other elements in baseband subsystem 100 (FIG. 1). The VCO 300 is further coupled to a digital-to-analog converter (DAC) 210 via connection 215. The connection 215 provides a second or high-pass input to the VCO 300. The DAC 210 receives a digital control signal along bus 201 from the controller 111. The DAC 210 converts the digital control signal into a corresponding analog or tuning voltage $V_{cal}$, HP. The VCO 300 generates an output signal on connection 305 that oscillates in response to the voltages applied at its low-pass and high-pass inputs. The output signal is coupled via connection 305 to amplifier 250, multiple-modulus divider 270 and a counter 290. The amplifier 250 receives the output of the VCO 300 and provides an amplified version of the VCO output via connection 255 to one or more devices external to the PLL 200 that require a stable reference frequency at N×the reference frequency, where N is the value applied via the multiple-modulus divider 270. The counter 290 provides a measure of the number of events over a designated period of time via connection 295 to the controller 111 (FIG. 1).

The feedback path 260 is arranged as follows. The feedback path 260 starts at connection 305, which couples the output of VCO 300 to the amplifier 250, the multiple-modulus divider 270 and the counter 290. The multiple-modulus divider 270 operates under the control of the sigma-delta modulator 280, which controls the multiple-modulus divider 270 via connection 285. The output of the multiple-modulus divider 270 is applied via connection 275 to a feedback input of the phase/frequency detector/charge pump 230. As shown in the illustrated embodiment, during nominal operation of the portable transceiver 100, low-pass data and channel information is received via connection 202 at the sigma-delta modulator 280.

In the illustrated embodiment, PLL 200 is integrated with the controller 111 (FIG. 1). In accordance with the $K_{vco}$ calibration software 116, the controller 111 forwards a signal along connection 203 that places the charge pump in a tri-state mode. When the charge pump operates in a tri-state mode, the feedback path 260 is opened and frequency/phase information from the multiple-modulus divider 270 is no longer applied at the PFD/CP 230. In addition, the controller 111 applies a desired voltage $V_{cal}$, LP via connection 204. In some embodiments, the controller 111 applies half the supply voltage or $V_{DD}/2$ to the PLL 200 on connection 204. The controller 111 also applies a first control signal via connection 201 to the DAC 210. As described above, the DAC 210 converts the first control signal and applies an analog tuning voltage $V_{cal}$, HP via connection 215 to the VCO 300. The controller 111 further applies a digital frequency control via bus 205 to the VCO 300. The digital word $B_0$-$B_n$ further tunes the output frequency of the VCO 300. Upon application of the above-described input signals, the controller 111 receives a first measure of the output frequency from the VCO 300 via the counter 290 and connection 295.

After recording the first frequency, the controller 111 keeps the charge pump 230 in the tri-state mode, maintains the same digital frequency control value and maintains the initial $V_{cal}$, LP while applying a second control signal via connection 201. The second control signal is different from the first control signal. The controller 111 receives a second measure of the output frequency from the VCO 300 via the counter 290 and connection 295. As will be explained in greater detail below, the controller 111 uses the first and second output frequency values and the first and second control or DAC values to determine $K_{vco}$.

Figure 3:
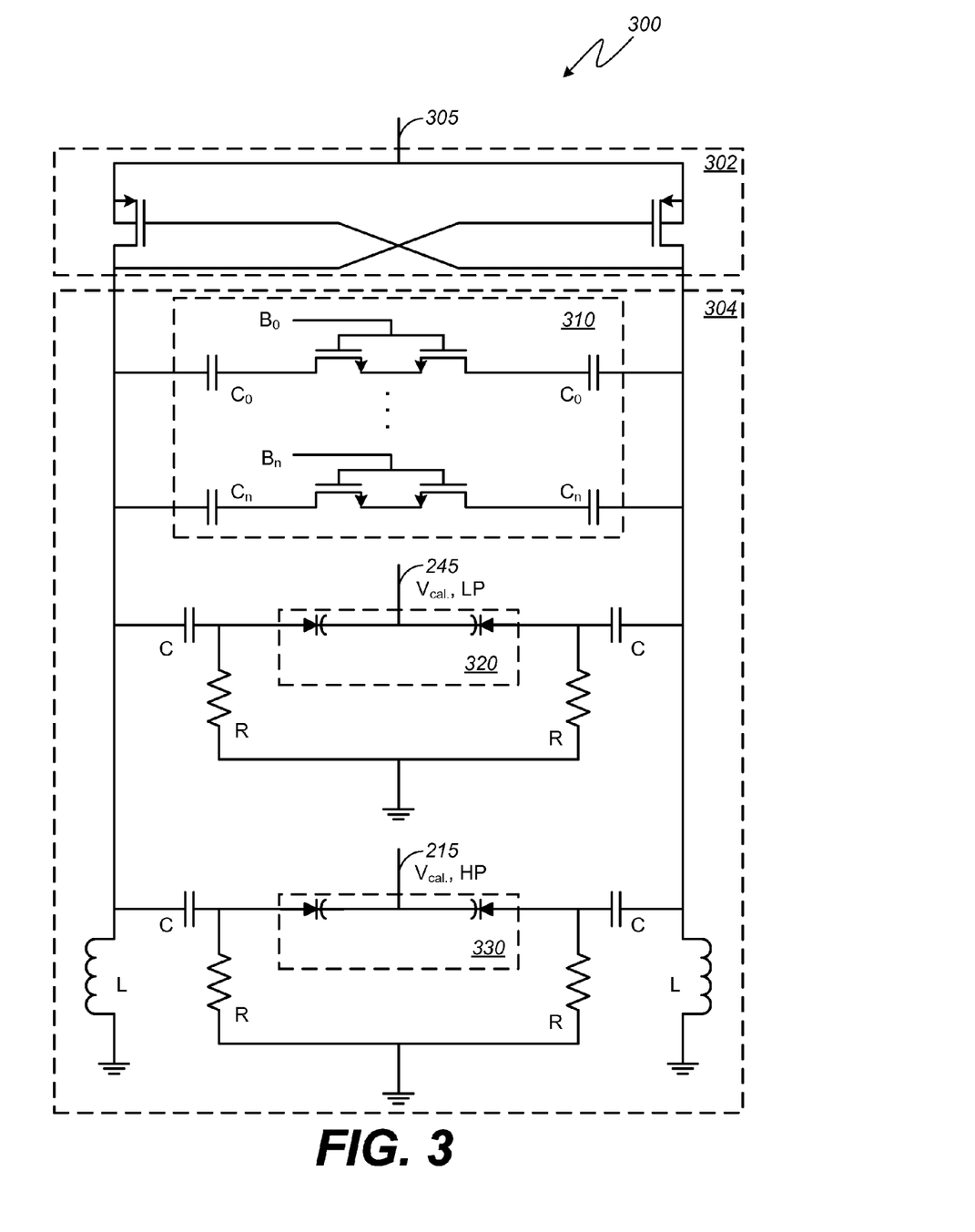
FIG. 3 is a block diagram illustrating an embodiment of the VCO of FIG. 2.

FIG. 3 is a circuit diagram illustrating an embodiment of the VCO 300 of FIG. 2. The VCO 300 includes an active portion 302 and a tank 304. The active portion 302 includes a pair of cross-coupled transistors that oscillate at the resonant frequency of the tank 304. The tank 304 includes an arrangement of balanced RC networks and inductors. The tank 304 further includes an N-bit tuning array 310 or an array of digitally controlled capacitors. In accordance with an N-bit control signal represented by inputs $B_0$ through $B_n$, the N-bit tuning array 310 adjusts the resonant frequency of the tank 304 by controllably inserting or removing a pair of capacitors associated with each digital bit of the N-bit control signal. Thus, the capacitors are switched in or switched out of the array of digitally controlled capacitors to provide a coarse frequency adjustment for the VCO 300. A first pair of varactors 320 are inserted between balanced RC networks and arranged to receive $V_{cal}$, LP via connection 245. The first pair of varactors 320, as driven by the voltage $V_{cal}$, LP, provide a first mechanism for continuous tuning of the VCO output frequency at connection 305. A second pair of varactors 330 are inserted between balanced RC networks and are arranged to receive $V_{cal}$, HP via connection 215. The second pair of varactors 330, as driven by the voltage $V_{cal}$, HP, provide a second mechanism for continuous tuning of the VCO output frequency at connection 305. As described above, when in a calibration mode, the controller 111 (FIG. 1) applies a steady desired voltage $V_{cal}$, LP. When the N-bit control signal is also kept constant and is set to achieve an output frequency that approximates the frequency required to configure the transmitter 130 (FIG. 1), the output frequency of the VCO 300 varies as a function of the change in the voltage $V_{cal}$, HP.

Figure 4:
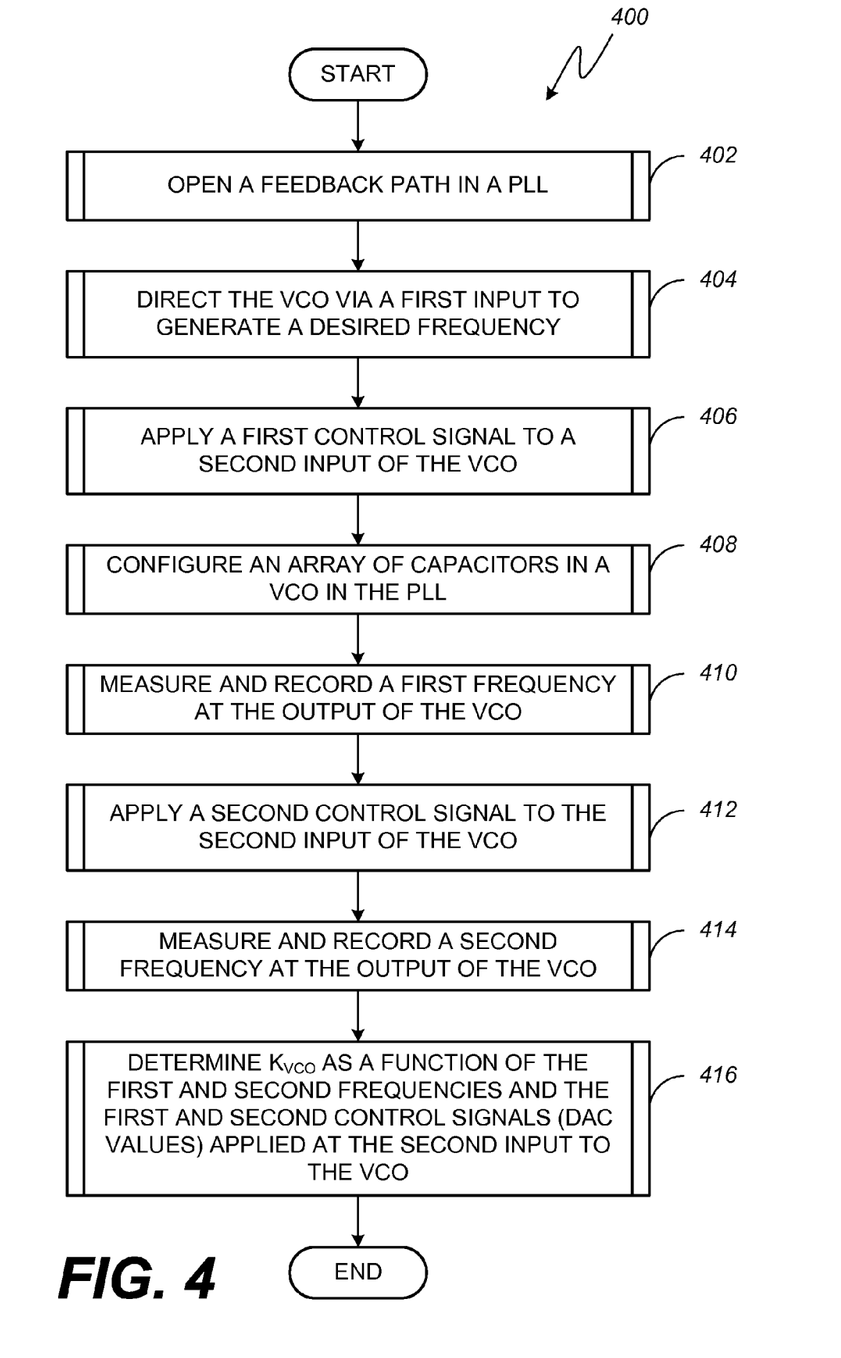
FIG. 4 is a flow diagram illustrating an embodiment of a method for determining the gain of the voltage-controlled oscillator of FIG. 3.

FIG. 4 is a flow diagram illustrating an embodiment of a method for determining the gain of the voltage-controlled oscillator 300 of FIG. 3. The flow diagram of FIG. 4 shows the architecture, functionality, and operation of a possible implementation via software and or firmware associated with a PLL arranged in a two-point modulation architecture, such as the PLL 200 of FIG. 2. In this regard, each block represents a module, segment, or portion of code, which comprises one or more executable instructions for implementing the specified function(s). When the PLL 200 is implemented via hardware, hardware and firmware or a combination of hardware and software, one or more blocks in the flow diagram may represent a circuit or circuits.

Method 400 begins with block 402 where the controller opens a feedback path the PLL. In block 404, the controller directs the VCO to generate a desired output frequency by applying a signal at a first input of the VCO. In block 406, the controller applies a first control signal to a second input of the VCO. In block 408, an array of capacitors in a VCO in the PLL is configured to result in an output frequency that is close to a desired value. Upon completion of the functions in blocks 402-408, the controller measures and records a first frequency at the output of the VCO, as indicated in block 410.

Thereafter, as shown in block 412, the controller applies a second control signal at the second input of the VCO. Next, the controller measures and records a second frequency at the output of the VCO, as indicated in block 414. Once the first and second frequencies have been recorded, the controller determines $K_{vco}$ as a function of the first and second frequencies and the first and second control values applied at the second input to the VCO, as shown in block 416.

Figure 5:
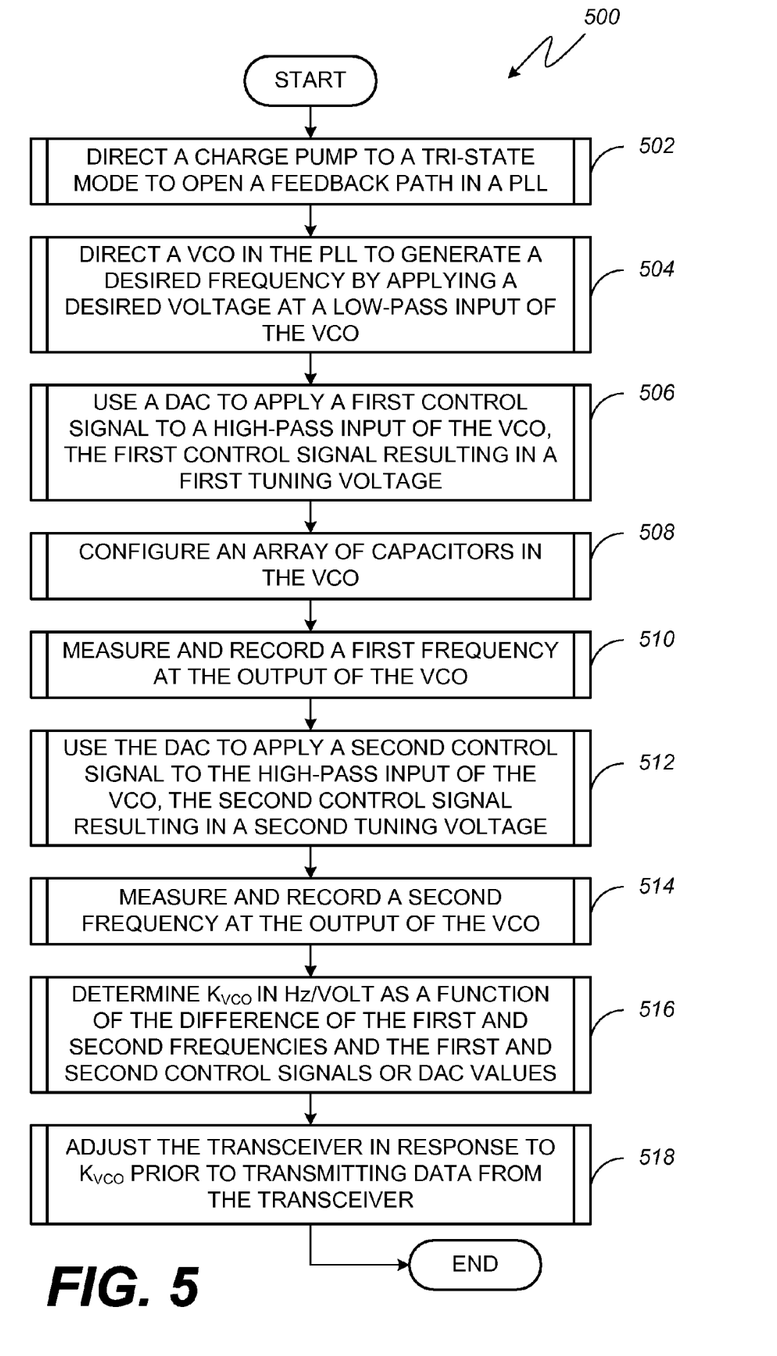
FIG. 5 is a flow diagram illustrating an embodiment of a method for calibrating a transceiver that uses a two-point modulation scheme.

FIG. 5 is a flow diagram illustrating an embodiment of a method 500 for calibrating a transceiver that uses a two-point modulation scheme. The flow diagram of FIG. 5 shows the architecture, functionality, and operation of a possible implementation via software and or firmware associated with a PLL arranged in a two-point modulation architecture, such as the PLL 200 of FIG. 2. In this regard, each block represents a module, segment, or portion of code, which comprises one or more executable instructions for implementing the specified function(s). When the PLL 200 is implemented via hardware, hardware and firmware or a combination of hardware and software, one or more blocks in the flow diagram may represent a circuit or circuits.

Method 500 begins with block 502 where a controller directs a charge pump in the PLL to a tri-state mode. When the charge pump is operating in the tri-state mode, the feedback path of the PLL is open. In block 504, the controller directs a VCO in the PLL to generate a desired frequency by applying a desired voltage at a low-pass input of the VCO. In block 506, the controller uses a DAC to apply a first control signal to a high-pass input of the VCO. In block 508, the controller configures an array of capacitors in the VCO to further tune the output frequency of the VCO. As further shown in block 508, the first control signal (digital) is converted by the DAC to a first tuning voltage (analog). Upon completion of the functions in blocks 502-508, the controller measures and records a first frequency at the output of the VCO, as indicated in block 510.

Thereafter, as shown in block 512, the controller uses the DAC to apply a second control signal at the high-pass input of the VCO. The second control signal (digital) is converted by the DAC to a second tuning voltage (analog). Next, the controller measures and records a second frequency at the output of the VCO, as indicated in block 514. Once the first and second frequencies have been recorded, the controller determines $K_{vco}$ in HZ/(DAC value) as a function of the difference of the first and second frequencies and the difference of the first and second control signals or DAC values, as shown in block 516. Thereafter, in block 518, the controller or other baseband elements adjust the transceiver in response to $K_{vco}$ prior to transmitting data from the transceiver.

Using the above described systems and methods determining $K_{vco}$ can be calibrated to the required accuracy well within the time available for configuring the transceiver prior to a data transmission burst, which is less than 150 μsec for some communication standards. The above described systems and methods for determining $K_{vco}$ are faster than prior art methods that wait for the PLL to settle. By using separate sets of varactors for low-pass and high-pass paths, $K_{vco}$ is independent of the voltage applied at the low-pass input of the VCO as long as the VCO frequency approximates its final value. Using a PLL with about 100 kHz loop bandwidth in calibration mode, the calibration can be achieved in well under 150 μsec. Assuming that a counter, registers and an arithmetic logic unit are available in a transceiver implementation, the above described methods can be performed without the need for additional circuitry.

As described above, the flow diagrams of FIGS. 4 and 5 show the architecture, functionality and operation of an implementation of example methods for determining $K_{vco}$ in a PLL. The described functions can be embodied in source code including human-readable statements written in a programming language or machine code that comprises instructions recognizable by a suitable execution system such as a processor in a computer system. The machine code may be converted from the source code, etc. If embodied in hardware, as in preferred embodiments, each block may represent a circuit or a number of interconnected circuits to implement the specified logical function(s).

While various embodiments of the systems and methods for VCO gain calibration have been described, it will be apparent to those of ordinary skill in the art that many more embodiments and implementations are possible that are within the scope of this disclosure. Accordingly, the systems and methods for VCO gain calibration are not to be restricted except in light of the attached claims and their equivalents.

What is claimed is:

1. A method for measuring the gain of a voltage-controlled oscillator (VCO) in a phase-locked loop (PLL) configured to apply a two-point modulation scheme, the method comprising:
   opening a feedback loop of the PLL;
   directing the VCO via a first input to produce a desired output frequency;
   applying a first control signal to a second input of the VCO;
   configuring an array of capacitors in the VCO;
   measuring the output frequency of the VCO responsive to the first control signal;
   applying a second control signal to the second input of the VCO;
   measuring the output frequency of the VCO responsive to the second control signal; and
   determining the gain of the VCO as a function of output frequencies responsive to voltage values applied at the second input of the VCO.

2. The method of claim 1 wherein directing the VCO via a first input includes applying a desired voltage at the first input of the VCO.

3. The method of claim 1 wherein directing the VCO via a first input includes applying approximately half the supply voltage to the PLL.

4. The method of claim 1 wherein directing the VCO via a first input includes applying a voltage to a first pair of dedicated varactors.

5. The method of claim 1 wherein applying a first control signal includes applying a first digital signal to a digital-to-analog converter coupled to the second input of the VCO.

6. The method of claim 1 wherein applying a second control signal includes applying a second digital signal different from the first digital signal to a digital-to-analog converter coupled to the second input of the VCO.

7. The method of claim 1 wherein applying a first control signal and applying a second control signal includes applying a voltage to a second pair of dedicated varactors.

8. The method of claim 1 wherein opening the feedback loop includes setting a charge pump to a tri-state mode.

9. The method of claim 1 wherein measuring the output frequency of the VCO includes using a counter.

10. The method of claim 1 wherein determining the gain of the VCO includes determining a ratio of the change in frequency and the change in voltage.

11. A system comprising:
    a phase-locked loop (PLL) arranged to receive high-pass data and low-pass data;
    a voltage controlled oscillator (VCO) having a first set of varactors configured to receive a low-pass tuning voltage based on the low-pass data and a second set of varactors configured to receive a high-pass tuning voltage based on the high-pass data; and
    a controller configured to coordinate a calibration procedure to determine a gain of the VCO.

12. The system of claim 11 wherein the controller is actuated prior to a transmission burst.

13. The system of claim 11 wherein the controller is implemented in a baseband portion of a transceiver that applies a two-point data modulation scheme.

14. The system of claim 11 wherein the controller and PLL are implemented within a GSM/EDGE single integrated-circuit transceiver.

15. The system of claim 11 wherein the controller determines a gain of the VCO absent feedback.

16. The system of claim 11 wherein the controller determines a gain of the VCO without locking the PLL.

17. The system of claim 11 wherein the controller directs the application of approximately Vdd/2 volts to the first set of varactors.

18. The system of claim 11 wherein the controller directs a charge pump to operate in a tri-state mode.

19. The system of claim 11 wherein the controller directs a counter to measure an output frequency of the VCO.

20. The system of claim 11 wherein the controller directs an arithmetic logic unit to calculate the gain of the VCO by dividing the difference of a second output frequency and a first output frequency by the difference of a second high-pass tuning voltage and a first high-pass tuning voltage.

21. A method for calibrating a transceiver configured to apply a two-point modulation scheme, the method comprising:
    directing a charge pump to a tri-state mode to open a feedback path in a phase-locked loop (PLL);

directing a voltage-controlled oscillator (VCO) in the PLL to generate a desired output frequency by applying a desired voltage at a low-pass data input to the VCO;

using a digital-to-analog converter to apply a first control signal to a high-pass data input of the VCO, the first control signal resulting in a first tuning voltage;

configuring an array of capacitors in the VCO;

measuring a first frequency at an output of the VCO, the first frequency corresponding to the first tuning voltage;

using the digital-to-analog converter to apply a second control signal different from the first control signal to the high-pass data input of the VCO, the second control signal resulting in a second tuning voltage;

measuring a second frequency at the output of the VCO, the second frequency corresponding to the second tuning voltage;

determining the gain of the VCO as a function of the difference of the second frequency and the first frequency and the difference of the second tuning voltage and the first tuning voltage; and adjusting the transceiver in response to the gain of the VCO prior to transmitting data from the transceiver.

* * * * *